United States Patent
Takahashi et al.

(10) Patent No.: US 7,595,358 B2
(45) Date of Patent: Sep. 29, 2009

(54) CORUNDUM FOR FILLING IN RESIN AND RESIN COMPOSITION

(75) Inventors: Yukihiko Takahashi, Kanagawa (JP); Tomiharu Yamada, Kanagawa (JP)

(73) Assignee: Showa Denko K.K., Tokyo (JP)

( * ) Notice: Subject to any disclaimer, the term of this patent is extended or adjusted under 35 U.S.C. 154(b) by 651 days.

(21) Appl. No.: 10/559,190

(22) PCT Filed: Jun. 3, 2004

(86) PCT No.: PCT/JP2004/008059

§ 371 (c)(1),
(2), (4) Date: Dec. 1, 2005

(87) PCT Pub. No.: WO2004/108812

PCT Pub. Date: Dec. 16, 2004

(65) Prior Publication Data

US 2006/0167157 A1 Jul. 27, 2006

(30) Foreign Application Priority Data

Jun. 4, 2003 (JP) ............................. 2003-158802

(51) Int. Cl.
*C08K 3/22* (2006.01)
(52) U.S. Cl. ...................................... 524/430; 428/329
(58) Field of Classification Search ................... 524/430
See application file for complete search history.

(56) References Cited

U.S. PATENT DOCUMENTS

| 5,840,465 | A | * | 11/1998 | Kakinuma et al. ........ 430/270.1 |
| 6,031,025 | A | | 2/2000 | Mercer et al. |
| 6,096,414 | A | | 8/2000 | Young |
| 6,169,142 | B1 | | 1/2001 | Nakano et al. |

FOREIGN PATENT DOCUMENTS

| CA | 2061093 A1 | | 8/1992 |
| EP | 0499585 A1 | | 8/1992 |
| JP | 05-132576 | * | 5/1993 |
| JP | 2001-348488 A | | 12/2001 |

OTHER PUBLICATIONS

Alcan Alumina Advertisement, Dec. 2002.*

* cited by examiner

*Primary Examiner*—Katarzyna Wyrozebski
(74) *Attorney, Agent, or Firm*—Sughrue Mion, PLLC

(57) ABSTRACT

One embodiment of the invention provides the corundum for filling in resin comprising three components having different secondary particle sizes and specific surface areas as follows: component X of 35 to 80 μm and 1 to 0.01 m$^2$/g; component Y of 1 to 5 μm and 3 to 0.5 m$^2$/g; and component Z of 0.3 to 1.5 μm and 15 to 3 m$^2$/g, with a composition ratio by mass (X:Y:Z) being in the range surrounded by four points of (60:40:0), (95:0:5), (95:5:0) and (60:0:40) not including the borderlines in the ternary compositional diagram, and a composition obtained by filling a specific amount of the corundum into silicone oil has a viscosity of less than 2,000 poise and a linseed oil absorption of 10 ml/100 g or less.

15 Claims, 2 Drawing Sheets

CORUNDUM FOR FILLING IN RESIN AND RESIN COMPOSITION

CROSS-REFERENCE TO RELATED APPLICATIONS

This is an application filed pursuant to 35 U.S.C. Section 111(a) with claiming the benefit of U.S. provisional application Ser. No. 60/477,958 filed Jun. 13, 2003 under the provision of 35 U.S.C. 111(b), pursuant to 35 U.S.C. Section 119(e)(1).

TECHNICAL FIELD

The present invention relates to a highly thermally conductive corundum, which is mainly used as a filler for resins such as plastics, rubbers and greases, and also relates to a resin composition using the corundum.

BACKGROUND ART

Heretofore, a corundum (the mineral name for aluminum oxide) has been widely used as a filler for filling in rubbers and plastics. For example, in silicone resin, silicone rubber and epoxy resin, the corundum is used as a heat-radiating filler. In the case of use as a high thermally conductive filler, the heat conducting performance is enhanced when the corundum is filled in a larger amount. However, if the amount filled exceeds 80 vol %, this causes a problem that the resin does not fit to the filler and cannot be shaped.

In order to solve this problem, a mixture of three alumina particle components differing in the particle size has been proposed (see, for example, JP-A-5-132576 (the term "JP-A" as used herein means an "unexamined published Japanese patent application"(European Patent No.499585) and JP-A-2001-348488).

However, this corundum has a problem in that since three components differing in the particle size are merely mixed, fine particles are not successfully dispersed and also in that the corundum particle is inferior in the plane smoothness and therefore, has a large linseed oil absorption and the resin composition using this corundum has a high viscosity.

An object of the present invention is to solve the above-described problems and provide a corundum for filling in resins, which enables filling of the corundum in an ever-larger amount while reducing the viscosity by improving the blending ratio of a conventional corundum filled in resins such as plastic and rubber and ensures high thermal conductivity and high productivity. The object of the present invention includes providing a composition using the corundum.

DISCLOSURE OF INVENTION

As a result of intensive efforts and investigations to attain this object, the present inventors have accomplished the present invention. That is, the present invention comprises the followings.

(1) A corundum for filling in resin, comprising a corundum X having an average secondary particle size of 35 to 80 μm and a specific surface area of 0.01 to 1 m$^2$/g as measured by the nitrogen adsorption method (BET method), a corundum Y having an average secondary particle size of 1 to 5 μm and a specific surface area of 0.5 to 3 m$^2$/g, and a corundum Z having an average secondary particle size of 0.3 to 1.5 μm and a specific surface area of 3 to 15 m$^2$/g, the composition ratio by mass (X:Y:Z) being in the range surrounded by four points of (60:40:0), (95:0:5), (95:5:0) and (60:0:40) not including the borderlines in the ternary compositional diagram with an assumption that the entire is 100 mass %, wherein a composition obtained by filling 300 parts by mass of the corundum into 100 parts by mass of silicone oil has a viscosity of less than 2,000 poise as measured at 35° C. by a Brookfield-type viscometer and a linseed oil absorption of 10 ml/100 g or less.

(2) A resin composition comprising the corundum for filling in resin described in (1) above and polymer compounds.

(3) The resin composition as described in (2) above, wherein the polymer compounds include at least one member selected from the group consisting of an aliphatic resin, an unsaturated polyester resin an acrylic resin, a methacrylic resin, a vinyl ester resin, an epoxy resin and a silicone resin.

(4) The resin composition as described in (2) or (3) above, wherein the content of the corundum for filling in resin is 80 mass % or more.

(5) The resin composition as described in any one of (2) to (4) above, wherein the corundum for filling in resin is coated with a silane coupling agent.

(6) The resin composition as described in any one of (2) to (4) above, wherein the corundum for filling in resin is coated with a compound having any one or more group of an amino group, a carboxyl group and an epoxy group.

(7) The resin composition as described in any one of (2) to (4) above, wherein the corundum for filling in resin is coated with a modified silicone oil.

(8) The resin composition as described in any one of (5) to (7) above, wherein the coverage of a silane coupling agent, a compound having any one or more group of an amino group, a carboxyl group and an epoxy group, or a silicone oil is from 0.05 to 5 mass % based on the corundum for filling in resin.

(9) The resin composition as described in any one of (2) to (8) above, wherein the composition has a sheet form or grease form.

(10) A method for producing a corundum for filling in resin, comprising blending three components consisting of a corundum X having an average secondary particle size of 35 to 80 μm and a specific surface area of 0.01 to 1 m$^2$/g as measured by the nitrogen adsorption method (BET method), a corundum Y having an average secondary particle size of 1 to 5 μm and a specific surface area of 0.5 to 3 m$^2$/g, and a corundum Z having an average secondary particle size of 0.3 to 1.5 μm and a specific surface area of 3 to 15 m$^2$/g by a ball mill or a jet mill at a ratio (X:Y:Z) falling in the range surrounded by four points of (60:40:0), (95:0:5), (95:5:0) and (60:0:40) not including the borderlines in the ternary compositional diagram with an assumption that the entire is 100 mass %.

(11) The corundum for filling in resin produced by the method as described in (10) above.

(12) The resin comprising the corundum for filling in resin as described in (11) above.

(13) An electronic component or semiconductor device comprising the resin as described in any one of (2) to (9) and (12) above.

(14) A CPU or PDP comprising the resin as described in any one of (2) to (9) and (12) above.

(15) A peripheral equipment for batteries, or a peltier element, an inverter or a power transistor, comprising the resin as described in any one of (2) to (9) and (12) above.

DETAILED DESCRIPTION OF INVENTION

In one embodiment of the invention, the corundum for filling in resin is characterized by comprising a corundum X having an average secondary particle size of 35 to 80 μm and a specific surface area of 1 to 0.01 m$^2$/g as measured by the nitrogen adsorption method (BET method), a corundum Y having an average secondary particle size of 1 to 5 μm and a specific surface area of 3 to 0.5 m$^2$/g, and a corundum Z having an average secondary particle size of 0.3 to 1.5 μm and a specific surface area of 15 to 3 m$^2$/g, the composition ratio by mass (X:Y:Z) being in the range surrounded by four points of (60:40:0), (95:0:5), (95:5:0) and (60:0:40) not including the borderlines in the ternary compositional diagram with an assumption that the entire is 100 mass %, wherein a composition obtained by filling 300 parts by mass of the corundum into 100 parts by mass of silicone oil has a viscosity of less than 2,000 poise, preferably less than 1,700 poise, as measured at 35° C. by a Brookfield-type viscometer and a linseed oil absorption of 10 ml/100 g or less.

The corundum is a mineral name denoting an aluminum oxide and the corundum in the present invention is an aluminum oxide containing 90% or more of the α-form crystal. The average secondary particle size means $D_{50}$ analyzed by laser diffraction method.

The present inventors have made studies on the corundum for filling in resin, which can ensure high thermal conductivity and when filled in a resin, low viscosity, as a result, it has been found that this object can be achieved by blending three corundum powder components each specified in the average secondary particle size and specific surface area at a specific ratio with use of a ball mill, a jet mill or the like while applying a shear force. By blending these components while applying a shear force, fine particles are uniformly dispersed around a coarse particle, so that the linseed oil absorption of the corundum and in turn, the viscosity of the resin composition can be decreased. As proved in Examples of JP-A-5-132576 (European Patent No.499585), this effect is insufficient if those components are blended by a stirrer having a stirring blade. With respect to the method of blending particles while applying a shear force, for example, a rotary, vibrating or medium-stirring ball mill, a jet mill or a Henschel mixer can be used. Among these, a ball mill and a jet mill are preferred and on taking account of contamination by abrasion or the like, a ball mill using an alumina medium is more preferred. In this blending while applying a shear force, the particle size of each corundum X, Y or Z is scarcely changed.

Figure 1:
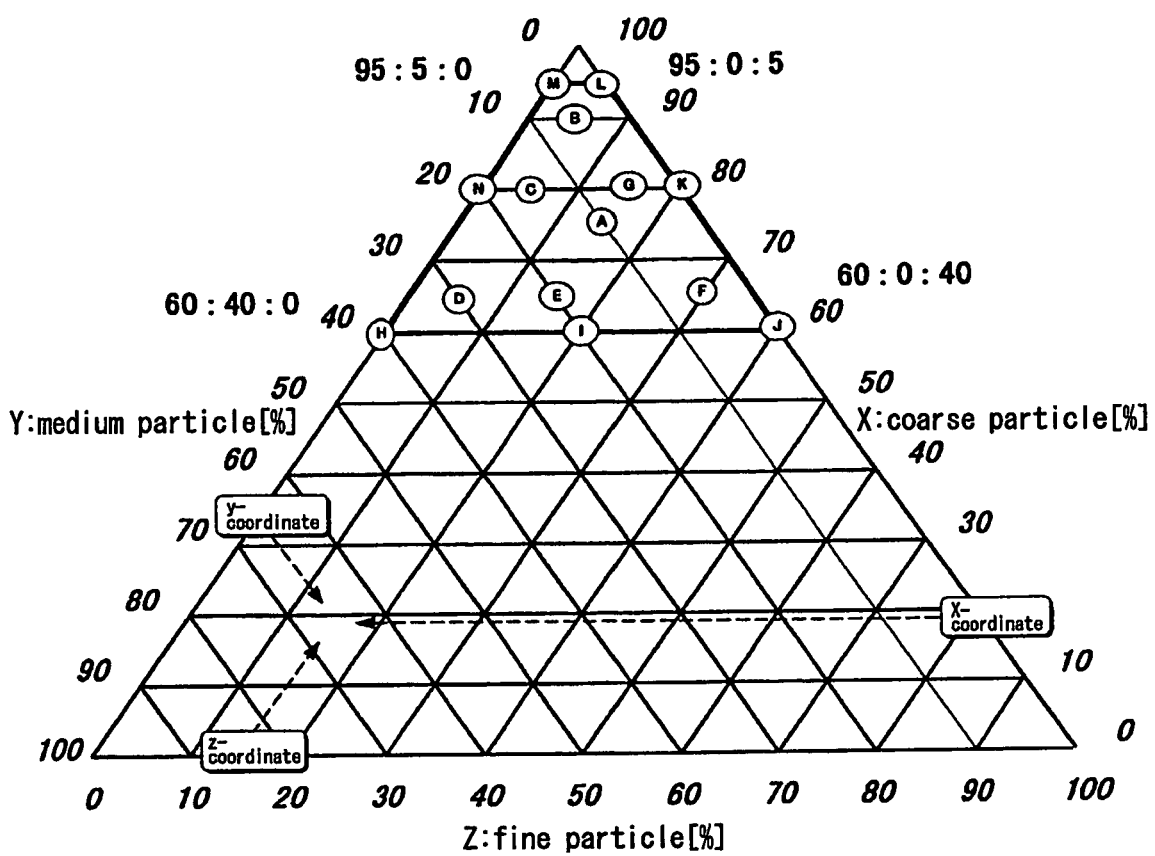
FIG. 1 is a ternary compositional diagram showing the composition ratio of three corundums for use in the present invention.

In one embodiment of the invention, the mixing ratio by mass of three corundums is, in the ternary compositional diagram with an assumption that the total of coarse particle corundum X, medium particle corundum Y and fine particle corundum Z is 100 mass %, as shown in FIG. 1, present in the range surrounded by four points of (X:Y:Z)=(60:40:0), (95:0:5), (95:5:0) and (60:0:40) (in FIG. 1, the range surrounded by H, J, M and L) not including the borderlines, preferably in the range surrounded by (60:40:0), (90:0:10), (90:10:0) and (60:0:40). If the mass ratio is out of the range surrounded by H, J, M and L, this might cause increase in the linseed oil absorption of the corundum and in turn, the viscosity of the resin composition.

The viscosity of the corundum for filling in resin in the present invention is shown by a viscosity when a resin composition obtained by filling 400 parts by mass of the corundum into 100 parts by mass of a silicone oil is measured at 35° C. by a Brookfield-type viscometer.

The linseed oil absorption of the composition is measured in terms of the necessary amount for 100 g of powder according to JIS K5101.

In one embodiment of the invention, the coarse particle corundum X is preferably a particle having no cutting edge. The average secondary particle size thereof is from 35 to 80 μm, preferably 40 to 70 μm, and the specific surface area as measured by the nitrogen adsorption method (BET method) is from 1 to 0.01 m$^2$/g, preferably from 0.5 to 0.01 m$^2$/g. If the average secondary particle size is less than 35 μm, this is close to the particle size of the medium particle corundum Y described later and therefore, the effect of decreasing the viscosity on blending the particles might be low. If the average secondary particle size exceeds 80 μm, when filled in a resin, the strength might extremely decrease or the surface roughness might become large. If the specific surface area exceeds 1.0 m$^2$/g, when filled in a resin, the curing might take a long time.

In one embodiment of the invention, the medium particle corundum Y has an average secondary particle size of 1 to 5 μm, preferably from 2 to 4 μm, and a specific surface area of 3 to 0.5 m$^2$/g, preferably from 2 to 0.5 m$^2$/g. If the average secondary particle size is less than 1 μm, this is close to the particle size of the fine particle corundum Z described later and therefore, the effect of decreasing the viscosity on blending the particles might be low, whereas if the average secondary particle size exceeds 5 μm, this is close to the particle size of the coarse particle corundum X and therefore, the effect of decreasing the viscosity on blending the particles might be low. If the specific surface area exceeds 3 m$^2$/g, when filled in a resin, the dispersion of the particle might be insufficient or the curing might take a long time.

In one embodiment of the invention, the fine particle corundum Z has an average secondary particle size of 0.3 to 1.5 μm, preferably from 0.5 to 1 μm, and a specific surface area of 15 to 3 m$^2$/g, preferably from 10 to 3 m$^2$/g. If the average secondary particle size exceeds 1.5 μm, this is close to the particle size of the medium particle corundum Y and therefore, the effect of decreasing the viscosity on blending the particles might be low, whereas if the average secondary particle size is less than 0.3 μm, the handleability might be worsened. If the specific surface area exceeds 15 m$^2$/g, when filled in a resin, the dispersion of the particles might be insufficient or the curing might take a long time.

In one embodiment of the invention, the corundum for filling in resin is preferably filled in an oil or a polymer compound such as rubber and plastic and can be suitably used as a highly thermally conductive grease composition, a highly thermally conductive rubber composition or a highly thermally conductive plastic composition. In particular, the content of the corundum for filling in resin is preferably made to be 80 mass % or more.

In one embodiment of the invention, the polymer compound constituting the composition may be a known polymer compound, but preferred examples thereof include an aliphatic resin, an unsaturated polyester resin, an acrylic resin, a methacrylic resin, a vinyl ester resin, an epoxy resin and a silicone resin.

These resins each may be a low molecular weight polymer or a high molecular weight polymer or may be in the form of oil, rubber or cured product and this may be arbitrarily selected according to the purpose for which the resin is used and the environment.

Examples of the resin include a hydrocarbon-based resin (e.g., polyethylene, ethylene-vinyl acetate copolymer, ethylene-acrylate copolymer, ethylene-propylene copolymer, poly (ethylene-propylene), polypropylene, polyisoprene, poly(isoprene-butylene), polybutadiene, poly(styrene-butadiene), poly(butadiene-acrylonitrile), polychloroprene, chlorinated polypropylene, polybutene, polyisobutylene, olefin resin, petroleum resin, styrol resin, ABS resin, chroman-.indene resin, terpene resin, rosin resin, diene resin); a (meth) acrylic resin (for example, a resin obtained by homopolymerizing a monomer such as methyl (meth)acrylate, ethyl (meth)acrylate, 2-ethylhexyl (meth)acrylate, n-nonyl (meth)acrylate, (meth)acrylic acid and glycidyl (meth)acrylate, a resin obtained by copolymerizing a plurality of these monomers, polyacrylonitrile and a copolymer thereof, polycyanoacrylate, polyacrylamide, and poly(meth)acrylate); a vinyl acetate- or vinyl alcohol-based resin (e.g., vinyl acetate resin, polyvinyl alcohol, polyvinyl acetal-based resin, polyvinyl ether); a halogen-containing resin (e.g., vinyl chloride resin, vinylidene chloride resin, fluorine-based resin); a nitrogen-containing vinyl resin (e.g., polyvinylcarbazole, polyvinylpyrrolidone, polyvinylpyridine, polyvinylimidazole); a diene-based polymerization product (e.g., butadiene-based synthetic rubber, chloroprene-based synthetic rubber, isoprene-based synthetic rubber); polyethers (e.g., polyethylene glycol, polypropylene glycol, hydrin rubber, Penton resin); a resin of polyethyleneimines; a phenol-based resin (e.g., phenol.formalin resin, cresol.formalin resin, modified phenol resin, phenol.furfural resin, resorcin resin); an amino resin (e.g., urea resin, modified urea resin, melamine resin, guanamine resin, aniline resin, sulfonamide resin); an aromatic hydrocarbon-based resin (e.g., xylene-formaldehyde resin, toluene.formalin resin); a ketone resin (e.g., cyclohexanone resin, methyl ethyl ketone resin); a saturated alkyd resin; an unsaturated polyester resin (e.g., maleic anhydride-ethylene glycol polycondensate, maleic anhydride-phthalic anhydride-ethylene glycol polycondensate); an allyl phthalate resin (for example, a resin obtained by crosslinking an unsaturated polyester resin with diallyl phthalate); a vinyl ester resin (for example, a resin obtained by crosslinking a primary polymer having a highly reactive acryl double bond at the terminal and having a bisphenol A-type ether bond in the main chain, with styrene, acryl ester or the like); an allyl ester resin; polycarbonate; a polyphosphoric acid ester resin; a polyamide resin; a polyimide resin; a silicone resin (for example, a silicone oil such as polydimethylsiloxane, a silicone rubber, a silicone resin and a reactive silicone resin having in the molecule a hydrosiloxane, hydroxysiloxane, alkoxysiloxane or vinylsiloxane structure and being curable by a catalyst or heat); a furan resin; a polyurethane resin; a polyurethane rubber; an epoxy resin (for example, those using a condensate of bisphenol A with epichlorohydrin, a condensate of novolak-type phenolic resin with epichlorohydrin, or a condensate of a polyglycol with epichlorohydrin); a phenoxy-type resin; and modified products thereof. One of these may be used alone or two or more of the resins may be used in combination.

These polymer materials each may have a low molecular weight or a high molecular weight or may be in the form of oil, rubber or cured product and this may be arbitrarily selected according to the purpose for which the resin is used and the environment.

Among these, more preferred are an unsaturated polyester resin, an acrylic resin, a methacrylic resin, a vinyl ester resin, an epoxy resin and a silicone resin.

The polymer material is also preferably an oily substance. Grease obtained by mixing the corundum for filling in resin and an oil not only follows the unevenness of a heating element and a heat radiator but also can narrow the space therebetween to more enhance the heat-radiating effect.

The oil which can be used is not particularly limited and a known oil can be used. Examples thereof include a silicone oil, a petroleum-based oil, a synthetic oil and a fluorine-based oil.

In one embodiment of the invention, the surface of the corundum for filling in resin is preferably coated with a silane coupling agent, a compound having any one or more group of an amino group, a carboxyl group and an epoxy group, or a silicone oil.

When the surface-treated corundum for filling in resin is kneaded with a resin, the content of the corundum in the composition can be increased as compared with the case where a surface-untreated corundum for filling in resin is kneaded with a resin. Furthermore, even when the amount of the corundum for filling in resin contained in the composition is increased, increase in the viscosity of the kneaded product is relatively small and the flexibility of the composition is less lost, so that the composition can be enhanced in the machine resistance or the like.

The silane coupling agent may be sufficient if it has a hydrolyzable substituent such as halogen atom or alkoxy group on the silicon atom, and a known compound can be used. Preferred examples thereof include vinyltrichlorosilane, vinyltrimethoxysilane, β-(3,4-epoxycyclohexyl)ethyltrimethoxysilane, γ-glycidoxypropyltriethoxysilane, γ-methacryloxypropyltrimethoxysilane, γ-aminopropyltriethoxysilane, N-phenyl-γ-aminopropyltrimethoxysilane, γ-chloropropyltrimethoxysilane, γ-mercaptopropyltrimethoxysilane, n-hexyltrimethoxysilane, n-octyltrimethoxysilane, n-dodecyltrimethoxysilane, phenyltriethoxysilane, diphenyldimethoxysilane and hexamethyldisilazane. One of these may be used alone, or two or more of the compounds may be used in combination.

The compound having one or more group of an amino group, a carboxyl group and an epoxy group is preferably a compound capable of readily adsorbing or reacting on the surface of corundum for filling in resin under the action of such a group, and a known compound can be used.

Preferred examples thereof include 1,2-epoxyhexane, 1,2-epoxydodecane, n-hexylamine, n-dodecylamine, p-n-hexylaniline, n-hexylcarboxylic acid, n-dodecylcarboxylic acid and p-n-hexylbenzoic acid.

As for the modified silicone oil, preferred examples thereof include KF-105, KF-101, KF-102, X-22-173DX, KF-393, KF-864, KF-8012, KF-857, X-22-3667, X-22-162A, X-22-3701E (all of these mentioned above are produced by Shin-Etsu Chemical Co., Ltd.), TSF4700, TSF4701, TSF4702, TSF4703, TSF4730*, TSF4770 (all of these mentioned above are produced by GE Toshiba Silicones), SF8417, BY16-828, BY16-849, BY16-892, BY16-853, BY16-837, SF8411, BY16-875, BY16-855, SF8421, SF8418 and BY16-874 (all of these as mentioned above are produced by Toray Dow Corning Silicone Co., Ltd.). One of these may be used alone, or two or more of the modified silicone oils may be used in combination.

The method for coating such a compound on the corundum for filling in resin is not particularly limited and a known method may be used. Examples thereof include a dry processing method and a wet processing method.

The coverage of the silane coupling agent or the like on the corundum for filling in resin is preferably from 0.05 to 5 mass % based on the corundum for filling in resin. If the coverage is less than 0.05 mass %, the coating effect might be difficult to obtain, whereas if the coverage exceeds 5 mass %, the content of unreacted silane coupling agent or the like might increase, for example, in that such a compound might remain unreacted as an impurity.

When the composition of the present invention is formed into a sheet or grease and inserted between the heat-generating portion of an electronic component or semiconductor device and the high thermally conductive component or plate, the heat generated can be efficiently dissipated and the electronic component or semiconductor device can be prevented from heat deterioration or the like and thereby reduced in failure rate or favored with a prolonged life. The electronic component or semiconductor device is not particularly limited, but specific examples thereof include CPU (central processing unit) of computers, PDP (plasma display), energy devices (for example, lead storage battery and secondary battery capacitor) or peripheral equipment thereof (for example, in a hybrid electric vehicle, a device of providing the thermally conductive composition between the secondary battery and the heat radiator to control the temperature and thereby stabilize battery properties), a heat radiator of electric motors, a Peltier element, an inverter and a (high) power transistor super-luminosity LED.

BEST MODE FOR CARRYING OUT THE INVENTION

The present invention is described in greater detail below by referring to Examples and Comparative Examples, however, the present invention is not limited to these Examples.

EXAMPLES 1 TO 7

Three components, that is, a coarse corundum X having an average secondary particle size of 49 μm and a specific surface area of 0.5 m$^2$/g, a medium particle corundum Y having an average secondary particle size of 3.0 μm and a specific surface area of 1.2 m$^2$/g and a fine particle corundum Z having an average secondary particle size of 0.5 μm and a specific surface area of 6.5 m$^2$/g, were blended at a composition ratio shown in Table 1 for 30 minutes by charging 1 kg of corundums and 4 kg of alumina balls into a 4 liter-volume vibrating ball mill to obtain a particles-blended corundum.

Here, 300 parts by mass of the particles-blended corundum was filled in 100 parts by mass of a commercially available silicone oil (TSE3070, produced by GE Toshiba Silicones) and the viscosity was measured at 35° C. by a Brookfield-type viscometer. Also, the oil absorption of the particles-blended corundum was determined according to JIS K5101 by dropping linseed oil No. 7 on 10 g of powder, kneading it and converting the amount of linseed oil at the end point into a necessary amount for 100 g of powder. The results are shown together in Table 1.

Figure 2:
FIG. 2 is an electron microphotograph image showing one example of the corundum in the present invention.

FIG. 2 shows an electron microphotograph of the particles-blended corundum obtained in Example 1. A composition obtained by filling 100 parts by mass of an epoxy resin with 1,400 parts by mass of this corundum and 2 parts by mass of acid anhydride was cured and then the thermal conductivity thereof was measured by using a laser flash-type thermal conductivity measuring device and found to be 10.5 W/m·K.

COMPARATIVE EXAMPLES 1 TO 7

At least the same two components as in Examples 1 to 7 were mixed at a composition ratio shown in Table 1 and then the same evaluations as in Examples 1 to 7 were performed.

COMPARATIVE EXAMPLES 8 TO 11

The same three components as in Examples 1, 2, 4 and 6 were charged in a 4 L-volume polyethylene container at a composition ratio shown in Table 1 and mixed by a shaker for 7 hours and then the same evaluations as in Examples 1 to 7 were performed.

COMPARATIVE EXAMPLE 12

Using a particles-blended corundum where the composition ratio and other components were the same as in Example 1 except for using a medium particle corundum Y having an average secondary particle size of 10.0 μm and a specific surface area of 1.9 m$^2$/g, the same evaluations as in Example 1 were performed.

COMPARATIVE EXAMPLE 13

Using a particles-blended corundum where the composition ratio and other components were the same as in Example 1 except for using a fine particle corundum Z having an average secondary particle size of 1.6 μm and a specific surface area of 1.8 m$^2$/g, the same evaluations as in Example 1 were performed.

COMPARATIVE EXAMPLE 14

Using a particles-blended corundum where the composition ratio and other components were the same as in Example 1 except for using a coarse particle corundum X having an average secondary particle size of 22.5 μm and a specific surface area of 0.8 m$^2$/g, the same evaluations as in Example 1 were performed.

TABLE 1

| | Abbreviation in FIG. 1 | Average Secondary Particle Size [μm] and Specific Surface Area [m$^2$/g] of Each Component | | | Composition Ratio [mass %] | | | Evaluation Results | |
|---|---|---|---|---|---|---|---|---|---|
| | | X: Coarse Particle | Y: Medium Particle | Z: Fine Particle | Coarse Particle | Medium Particle | Fine Particle | Viscosity [poise] | Oil Absorption [ml/100 g] |
| Example | | | | | | | | | |
| 1 | A | 49.0 μm, 0.5 m$^2$/g | 3.0 μm, 1.2 m$^2$/g | 0.5 μm, 6.5 m$^2$/g | 75 | 10 | 15 | 1520 | 6 |
| 2 | B | " | " | " | 90 | 5 | 5 | 1780 | 6 |
| 3 | C | " | " | " | 80 | 15 | 5 | 1720 | 7 |
| 4 | D | " | " | " | 65 | 30 | 5 | 1690 | 8 |
| 5 | E | " | " | " | 60 | 20 | 20 | 1810 | 9 |
| 6 | F | " | " | " | 65 | 5 | 30 | 1920 | 8 |
| 7 | G | " | " | " | 80 | 5 | 15 | 1800 | 7 |

TABLE 1-continued

| | Abbreviation in FIG. 1 | Average Secondary Particle Size [μm] and Specific Surface Area [m²/g] of Each Component | | | Composition Ratio [mass %] | | | Evaluation Results | |
|---|---|---|---|---|---|---|---|---|---|
| | | X: Coarse Particle | Y: Medium Particle | Z: Fine Particle | Coarse Particle | Medium Particle | Fine Particle | Viscosity [poise] | Oil Absorption [ml/100 g] |
| Comparative Example | | | | | | | | | |
| 1 | H | " | " | " | 60 | 40 | 0 | 2230 | 11 |
| 2 | I | " | " | " | 60 | 20 | 20 | 2640 | 12 |
| 3 | J | " | " | " | 60 | 0 | 40 | 3250 | 12 |
| 4 | K | " | " | " | 80 | 0 | 20 | 2900 | 11 |
| 5 | L | " | " | " | 95 | 0 | 5 | 2190 | 11 |
| 6 | M | " | " | " | 95 | 5 | 0 | 2150 | 10 |
| 7 | N | " | " | " | 80 | 20 | 0 | 2430 | 12 |
| 8 | A | " | " | " | 75 | 10 | 15 | 2560 | 8 |
| 9 | B | " | " | " | 90 | 5 | 5 | 3040 | 8 |
| 10 | D | " | " | " | 65 | 30 | 5 | 2720 | 10 |
| 11 | F | " | " | " | 65 | 5 | 30 | 3270 | 10 |
| 12 | A | " | 10.0 μm, 1.9 m²/g | " | 75 | 10 | 15 | 240 | 7 |
| 13 | A | " | 3.0 μm, 1.2 m²/g | 1.6 μm, 1.8 m²/g | 75 | 10 | 15 | 2140 | 8 |
| 14 | A | 22.5 μm, 0.8 m²/g | " | 0.5 μm, 6.5 m²/g | 75 | 10 | 15 | 3730 | 12 |

INDUSTRIAL APPLICABILITY

As apparent from Table 1, by mixing corundum powders each specified in the average secondary particle size and the specific surface area at a specific ratio while applying a shear force, when filled in a resin such as plastic and rubber, the viscosity decreases and high filling can be realized, so that a compound having high thermal conductivity can be obtained. Furthermore, long-time kneading required in conventional dispersion of fine particles is not necessary and the productivity and cost reduction can be more improved. In one embodiment of the invention, the corundum can have enhanced properties required for a corundum for filling in resin and in this meaning, its industrial effect is very large.

The invention claimed is:

1. A corundum for filling in resin, comprising a corundum X having an average secondary particle size of 35 to 80 μm and a specific surface area of 0.01 to 1 m²/g as measured by the nitrogen adsorption method (BET method), a corundum Y having an average secondary particle size of 1 to 5 μm and a specific surface area of 0.5 to 3 m²/g, and a corundum Z having an average secondary particle size of 0.3 to 1.5 μm and a specific surface area of 3 to 15 μm /g, the composition ratio by mass (X:Y:Z) being in the range surrounded by four points of (60:40:0), (95:0:5), (95:5:0) and (60:0:40) not including the borderlines in the ternary compositional diagram with an assumption that the entire is 100 mass %, wherein the amount of each of corundum Y and corundum Z is 5 mass % or more, and wherein a composition obtained by filling 300 parts by mass of the corundum into 100 parts by mass of silicone oil has a viscosity of less than 2,000 poise as measured at 35° C. by a Brookfield-type viscometer and a linseed oil absorption of 10 ml/100 g or less.

2. A resin composition comprising the corundum for filling in resin as claimed in claim 1 and polymer compounds.

3. The resin composition as claimed in claim 2, wherein the polymer compounds include at least one member selected from the group consisting of an aliphatic resin, an unsaturated polyester resin an acrylic resin, a methacrylic resin, a vinyl ester resin, an epoxy resin and a silicone resin.

4. The resin composition as claimed in claim 2, wherein the content of the corundum for filling in resin is 80 mass % or more.

5. The resin composition as claimed in claim 2, wherein the corundum for filling in resin is coated with a silane coupling agent.

6. The resin composition as claimed in claim 2, wherein the corundum for filling in resin is coated with a compound having any one or more group of an amino group, a carboxyl group and an epoxy group.

7. The resin composition as claimed in claim 2, wherein the corundum for filling in resin is coated with a modified silicone oil.

8. The resin composition as claimed in claim 5, wherein the coverage of a silane coupling agent, a compound having any one or more group of an amino group, a carboxyl group and an epoxy group, or a silicone oil is from 0.05 to 5 mass % based on the corundum for filling in resin.

9. The resin composition as claimed in claim 2, wherein the composition has a sheet form or grease form.

10. A method for producing a corundum for filling in resin, comprising blending three components consisting of a corundum X having an average secondary particle size of 35 to 80 μm and a specific surface area of 0.01 to 1 m²/g as measured by the nitrogen adsorption method (BET method), a corundum Y having an average secondary particle size of 1 to 5 μm and a specific surface area of 0.5 to 3 m²/g, and a corundum Z having an average secondary particle size of 0.3 to 1.5 μm and a specific surface area of 3 to 15 m²/g by a ball mill or a jet mill at a ratio (X:Y:Z) falling in the range surrounded by four points of (60:40:0), (95:0:5), (95:5:0) and (60:0:40) not including the borderlines in the ternary compositional diagram with an assumption that the entire is 100 mass %, and wherein the amount of each of corundum Y and corundum Z is 5 mass % or more.

11. The corundum for filling in resin produced by the method as claimed in claim 10.

12. The resin comprising the corundum for filling in resin as claimed in claim 11.

13. An electronic component or semiconductor device comprising the resin as claimed in claim 2.

14. A CPU or PDP comprising the resin as claimed in claim 2.

15. A peripheral equipment for batteries, or a peltier element, an inverter or a power transistor, comprising the resin as claimed in claim 2.

* * * * *